(12) United States Patent
Pernpeintner

(10) Patent No.: US 12,040,777 B2
(45) Date of Patent: Jul. 16, 2024

(54) MODIFIED SAW TRANSDUCER, SAW RESONATOR, AND SAW FILTER COMPRISING SAME

(71) Applicant: RF360 Singapore Pte. Ltd, Republic Plaza (SG)

(72) Inventor: Matthias Pernpeintner, Bavaria (DE)

(73) Assignee: RF360 Singapore Pte. Ltd., Singapore (SG)

( * ) Notice: Subject to any disclaimer, the term of this patent is extended or adjusted under 35 U.S.C. 154(b) by 309 days.

(21) Appl. No.: 17/440,158

(22) PCT Filed: Mar. 27, 2020

(86) PCT No.: PCT/EP2020/058716
§ 371 (c)(1),
(2) Date: Sep. 16, 2021

(87) PCT Pub. No.: WO2020/201088
PCT Pub. Date: Oct. 8, 2020

(65) Prior Publication Data
US 2022/0149812 A1 May 12, 2022

(30) Foreign Application Priority Data

Apr. 4, 2019 (DE) ..................... 10 2019 108 843.7

(51) Int. Cl.
*H03H 9/145* (2006.01)
*H03H 9/02* (2006.01)
(Continued)

(52) U.S. Cl.
CPC ........ *H03H 9/145* (2013.01); *H03H 9/02637* (2013.01); *H03H 9/25* (2013.01); *H03H 9/6483* (2013.01)

(58) Field of Classification Search
CPC ...... H03H 9/145; H03H 9/02637; H03H 9/25; H03H 9/6483; H03H 9/02803;
(Continued)

(56) References Cited

U.S. PATENT DOCUMENTS 7,042,132 B2   5/2006   Bauer et al.
7,078,989 B2 *   7/2006   Inoue .................... H03H 9/643
                                                            333/195

(Continued)

FOREIGN PATENT DOCUMENTS

DE   10111959 A1   9/2002
DE   10345239 A1   4/2005
(Continued)

OTHER PUBLICATIONS

International Search Report and Written Opinion—PCT/EP2020/058716—ISAEPO—Aug. 20, 2020.
(Continued)

*Primary Examiner* — Rakesh B Patel
*Assistant Examiner* — Jorge L Salazar, Jr.
(74) *Attorney, Agent, or Firm* — Polsinelli

(57) ABSTRACT

A SAW transducer and a SAW resonator are proposed composed of consecutively arranged unit cells of length L. Slight geometry or material variations such as variations of the metallization ration or the unit cell length L affecting the pitch) between these unit cells result in improved spurious mode suppression while the main mode performance is unaffected.

15 Claims, 4 Drawing Sheets

(51) Int. Cl.
*H03H 9/25* (2006.01)
*H03H 9/64* (2006.01)

(58) Field of Classification Search
CPC .......... H03H 9/02866; H03H 9/14517; H03H 9/6436; H03H 9/14555; H03H 9/643; H03H 9/6493; H03H 9/6496; H03H 9/1457
USPC ................................................ 333/133–196
See application file for complete search history.

(56) References Cited

U.S. PATENT DOCUMENTS

| | | | |
|---|---|---|---|
| 7,489,213 | B2 | 2/2009 | Ebner |
| 2004/0090145 | A1 | 5/2004 | Bauer et al. |
| 2011/0199163 | A1* | 8/2011 | Yamanaka ......... H03H 9/14582 331/158 |
| 2012/0161577 | A1* | 6/2012 | Abbott ............... H03H 9/02724 310/313 C |
| 2017/0244378 | A1* | 8/2017 | Kim ................... H03H 9/02992 |
| 2020/0162055 | A1* | 5/2020 | Goto ...................... H03H 9/643 |

FOREIGN PATENT DOCUMENTS

| | | |
|---|---|---|
| EP | 2357728 A1 | 8/2011 |
| EP | 2357729 A1 | 8/2011 |
| WO | 2002073800 | 9/2002 |
| WO | 2005036742 A1 | 4/2005 |

OTHER PUBLICATIONS

Partial International Search Report—PCT/EP2020/058716—ISA/EPO—Jun. 30, 2020.

* cited by examiner

MODIFIED SAW TRANSDUCER, SAW RESONATOR, AND SAW FILTER COMPRISING SAME

In addition to the desired main SAW mode which is typically a Rayleigh or SH-like mode, several spurious resonances can occur in SAW resonators. These spurious resonances can be due to e.g. transversal modes, differently polarized modes, volume modes or other unwanted modes. As a result of simulation and/or fabrication inaccuracies or due to competing optimization targets like high bandwidth, low temperature shift or small size, it may be impossible to fully suppress these unwanted spurious resonances.

Typical SAW resonators (including temperature-compensated SAW resonators and thin-film SAW resonators) consist of an interdigital transducer (IDT) which is enclosed by two reflecting gratings, fabricated on top of a piezoelectric substrate. Additional layers on top of the substrate and/or the electrode may be used e.g. for temperature compensation or passivation. The substrate may be bulk material or consisting of several layers of which at least one is piezoelectric. The IDT and the reflectors are typically made of a metal thin film which may consist of several layers and may be deposited on top of an adhesion layer or dielectric underlayer.

The IDT is formed by a concatenation of a number n of equal unit cells arranged consecutively in a longitudinal direction where i is a whole number ranging from 1 to n where dependent on the specific device n may be 15-250 or any other number suitable to achieve the desired acoustic excitation.

Each unit cell consists of two or more electrode fingers connected to different electrical potentials. Most of the unit cells have identical structure. In the typical case of a unit cell with two identical fingers, the geometry of the unit cell is mainly determined by its pitch complying with half of the length L of the unit cell and the metallization ratio $\eta$ (i.e. the electrode finger width divided by pitch).

It is known to apply a certain variation of the finger geometries in transversal direction, i.e. along the finger to shape the transversal mode profile. This variation can comprise broadened or thickened finger tips in order to avoid the excitation of transversal modes. Some of the unit cells of the IDT, in particular those close to the reflectors, may feature different pitch and/or metallization ratio in order to shape the mode profile along the main SAW propagation direction (known as longitudinal piston mode design).

Usually, the length $L_i$ of a unit cell $UC_i$ equals the wavelength $\lambda$ of the main SAW mode at the desired operational frequency of the transducer.

Similarly, a SAW reflector is typically formed by a concatenation of a number n of equal unit cells arranged consecutively in a longitudinal direction where i is a whole number ranging from 1 to n where dependent on the specific device n may be 3-30 or any other number suitable to achieve the desired acoustic reflection.

Each unit cell consists of one or more reflector fingers connected to a common electrical potential or to ground. Most of the unit cells have identical structure. In the typical case of a unit cell with one finger, the geometry of the unit cell is mainly determined by its pitch complying with the length L of the unit cell and the metallization ratio $\eta$ (i.e. the reflector finger width divided by pitch).

Similar to the transducer, certain variations of the finger geometries in transversal direction, i.e. along the finger, may be applied. This variations can comprise broadened or thickened fingers.

When integrated in a SAW resonator, some of the unit cells of the reflector, in particular those close to a transducer, may feature different pitch and/or metallization ratio in order to shape the mode profile along the main SAW propagation direction (known as longitudinal piston mode design). Usually, the length $L_i$ of a unit cell $RUC_i$ equals pr*$\lambda$, where $\lambda$ is the wavelength of the main SAW mode at the desired operational frequency of the resonator and pr is a scaling factor, which is typically between 0.7 and 1.3.

In a filter composed of resonators with transducers and reflectors, the spurious resonances usually lead to undesirable effects which cannot completely be avoided in present filters up to now. These effects may comprise unwanted dips in the passband or at the skirts thereof, deterioration of minimum insertion attenuation, reduced out-of-band reflection, reduced frequency trimming accuracy, reduced group delay uniformity, lower power durability and worse compression behavior. In addition, the existence of spurious modes poses restrictions to designers, as it usually has to be avoided that these resonances fall into very critical frequency ranges. As a consequence, other target parameters like skirt steepness, near band selection/isolation or maximum insertion attenuation may suffer.

Hence it is an object of the present invention to provide a SAW resonator that avoids at least some of the above mentioned undesirable effects.

This and other objects are met by a SAW transducer according to claim 1 and a SAW resonator according to claim 9. Further features and advantageous embodiments as well as a SAW resonator and a SAW filter device comprising such a transducer or resonator are subject of dependent claims.

The general idea is to apply a variation to at least two frequency-relevant parameters of the unit cells, so that locally, i.e. for each unit cell, the eigenfrequency of one/several spurious mode is increased/decreased, while the eigenfrequency of the main SAW mode is unaffected. There are various possibilities to change the eigenfrequency of acoustic modes; the most obvious way is the variation of pitch and $\eta$; but also local variations of the metal height and/or dielectric layer heights, layer material/composition or transversal geometry may be used to realize a local variation of the eigenfrequency of one/several unwanted acoustic modes. As an example, a respective metallization ratio $\eta_i$ and length $L_i$ is assigned to each of a unit cell $UC_i$ wherein for each two subsequently neighbored unit cells metallization ratio $\eta_i$ and length $L_i$ are slightly different. Each unit cell $UC_i$ of such a transducer is adapted to produce a respective wavelet $W_i$ different for each two subsequently neighbored unit cells.

Such parameter variations can be made at a SAW transducer and/or at a reflector used in a SAW resonator or a SAW filter device. With both variations the desired effect can be achieved and spurious modes are suppressed.

An advantageous effect of such a variation is that the eigenfrequency of any spurious mode that may be part of the respective wavelet is also dependent on this variation but in a different way and hence, the effect of the variation produces different shifts for eigenfrequencies of main mode and spurious mode.

As a further effect the eigenfrequencies of unwanted resonances, e.g. differently polarized spurious modes and/or transversal modes, are modified and therefore differ slightly between neighboring unit cells. These unwanted modes can therefore not be excited resonantly over the entire length of the transducer and the resulting contribution of these unwanted modes to the transducer's admittance is reduced and distributed over a larger frequency range. Further, the envelope of the acoustic excitation of the unwanted mode along the resonator's longitudinal direction may be modified and can be shaped in a way that the excitation strength of the unwanted mode is reduced and/or its frequency is shifted. Regarding the eigenfrequency of the main mode that is kept constant over all unit cells of the transducer, the superimposition of the excited wavelets of all individual unit cells is constructive for this frequency.

In a SAW resonator, a similar variation between the unit cells can also be applied to the reflectors, which may affect the reflector stopband width and frequency and therefore change the transmission, reflection and loss behavior of the resonator.

In a filter device comprising such resonators and/or reflectors this leads to improved insertion attenuation, smoother skirts, reduced group delay ripple, increased out-of-band reflection, improved compression and power durability behavior, and, potentially, reduces design restrictions resulting from non-vanishing spurious modes. When using two or more of such resonators with unit cells of equal eigenfrequency of the main SAW mode, but different eigenfrequencies of the spurious modes in a filter, impedance contributions due to spurious mode excitation can superimpose partly destructive and thus the impact of these unwanted modes on the filter performance can be reduced.

The mentioned local variation of the unit cells can be realized in various ways. A local variation of η and L is most easy to implement and consistent with state-of-the-art fabrication techniques. But also more sophisticated approaches, e.g. local variation of layer heights, electrode materials/compositions, complex electrode edge profiles or transversal geometry variations, may be applied.

According to an embodiment, a "slow" variation of these parameters from unit cell to unit cell is preferable. According to an embodiment a quasi-linear parameter variation from one end of a transducer to the other can be implemented wherein $L_i$ continuously increases and $\eta_i$ continuously decreases.

Alternatively, a sine-like variation of the parameters L and η with nodes at the IDT ends and a maximum variation in the center of the IDT is possible, such that two sine functions representing the course of L and η have a phase difference of π. In the middle of the interdigital transducer one of the parameters $L_i$ and $\eta_i$ may have a minimum and consequently the other parameter has a maximum.

Moreover, dependent on the used material system or resonator design more complex parameter profiles may be preferred. The relevant constraint for all these variations is that the eigenfrequency and/or the coupling of the main mode is not (or only slightly) changed by the applied variations between the unit cells.

The electrode fingers of the unit cells can have a transversal geometry profile such that a cross section thereof is at maximum near the tip of each electrode finger.

Besides local variations of transducer unit cells, also variations of reflector unit cells may be realized. These may include a certain offset of frequency-relevant parameters, like pitch and η, between reflector and IDT. This allows, e.g., to shift the reflector stopband relative to the resonance frequency for one/more spurious modes, while the main mode performance of the resonator is unaffected. This approach can reduce the excitation of unwanted modes further as it induces additional acoustic losses to these unwanted modes that do not affect the main mode.

According to an embodiment a SAW resonator consists of one or more transducers and one or more reflectors. At least one reflector is composed of reflector unit cells that are arranged consecutively in a longitudinal direction. Each reflector unit cell RUCi comprises two or more reflector fingers and shows a variation of at least two frequency-relevant parameters over the length of the reflector. As a result, in each reflector unit cell RUCi, the reflectivity of the desired main SAW mode is unchanged and the reflected wavelets superimpose constructively at the frequency of the main SAW mode. On the other side, the reflectivity of one or more spurious modes varies slightly from unit cell to unit cell and therefore the reflected wavelets of the spurious mode(s) superimpose partly destructively.

A SAW filter device may comprise at least one one-port resonator having such a transducer or reflector design. The resonators may be circuited in a ladder-type or lattice type arrangement of series and parallel arm resonators.

This idea can directly be transferred to quasi-periodic structures like a DMS filter that comprises resonators composed of two or more IDTs. The transducers may have chirped regions at their respective longitudinal ends. Each transducer IDT can be modified individually as described above, resulting in an improved suppression of spurious modes in all parts of the acoustic track individually. Such a DMS filter comprising an improved transducer and/or reflector has improved insertion attenuation, smoother skirts, reduced group delay ripple, increased out-of-band reflection, improved compression and power durability behavior, and, potentially, reduces design restrictions resulting from non-vanishing spurious modes.

In the following the invention is explained in more detail by reference to specific embodiments and the accompanied figures. The figures are schematic only and not drawn to scale.

Figure 1:
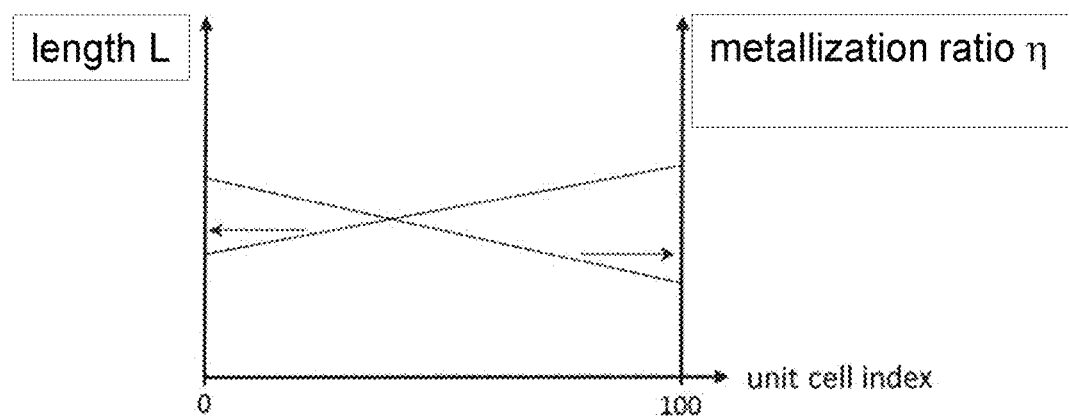
FIG. 1 shows the variation of the two parameters length $L_i$ and metallization ratio $\eta_i$ over the unit cell index of a transducer

FIG. 1 shows in a first embodiment a possible realization of the proposed parameter variation of two parameters of a transducer over the transducer in a longitudinal direction according to the unit cell index. In the example a transducer consisting of 100 unit cells is shown. The left y-axis is assigned to the length $L_i$ of the unit cells $UC_i$ that is proportional to the pitch and the wavelength that can be excited by this transducer. The right y-axis indicates the metallization ratio $\eta_i$ of a unit cell $UC_i$. The metallization ratio can be derived by dividing the width of the electrode fingers through the pitch.

In this embodiment length $L_i$ and metallization ratio η vary linearly from the first to the last unit cell of the transducer. The relative variation is chosen so that the eigenfrequency of the main mode is the same in all unit cells, but the eigenfrequency of one (or several) spurious modes varies over the length of the transducer.

Figure 2:
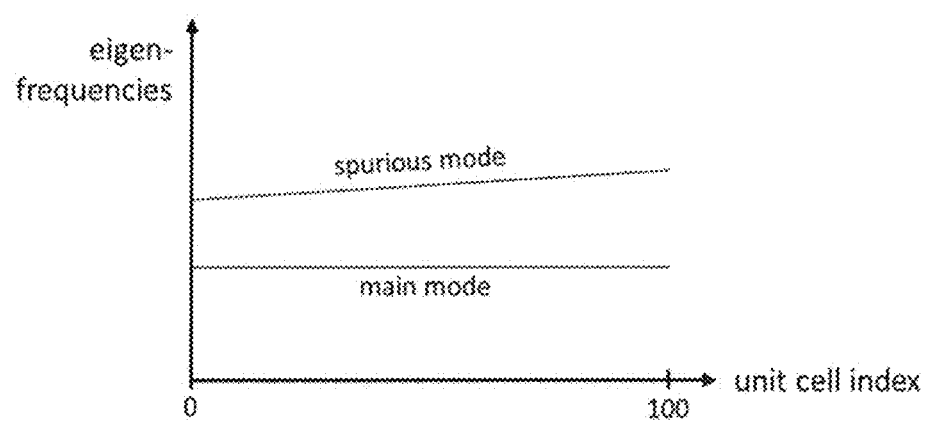
FIG. 2 shows the course of eigenfrequencies of the main mode and a spurious mode over the unit cell index of a transducer according to FIG. 1

FIG. 2 shows the course of these two eigenfrequencies over the length of a transducer having a parameter variation as shown in FIG. 1 which is optimized to achieve the above mentioned result. The course of the main mode does not vary over the transducer but the spurious mode does. Hence, each unit cell $UC_i$ produces a spurious mode the eigenfrequency of which is different to that of a neighboring unit cell $UC_{(i+1)}$ or $UC_{(i-1)}$. As a result the spurious mode portions of the wavelets produced by all unit cells of the transducer together do not superimpose fully constructively and hence, the disturbing spurious resonance peak is reduced or vanishes completely. As far as not extinguished by superposition the spurious mode contributions spread over a range of frequencies and do not appear at a single spurious mode frequency.

Figure 3:
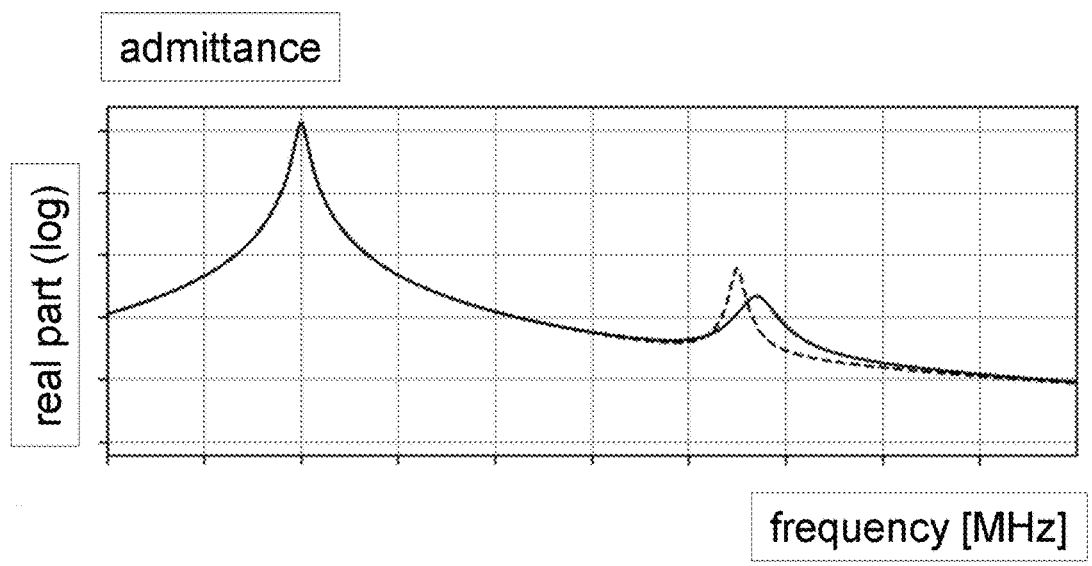
FIG. 3 shows the real part of the admittance of a resonator with a transducer according to FIG. 1

The solid line in the diagram of FIG. 3 shows the real part of the admittance of a SAW resonator comprising a parameter variation as shown in FIG. 1 compared with a respective admittance of a standard SAW resonator depicted by a dashed line. Above the pronounced maximum at the frequency of the main mode the standard SAW resonator shows a small peak caused by excitation of a differently polarized acoustic mode. This small peak nearly vanishes or is at least markedly reduced in height in the admittance curve of a transducer according to the proposed parameter variation depicted as a solid line.

Figure 4:
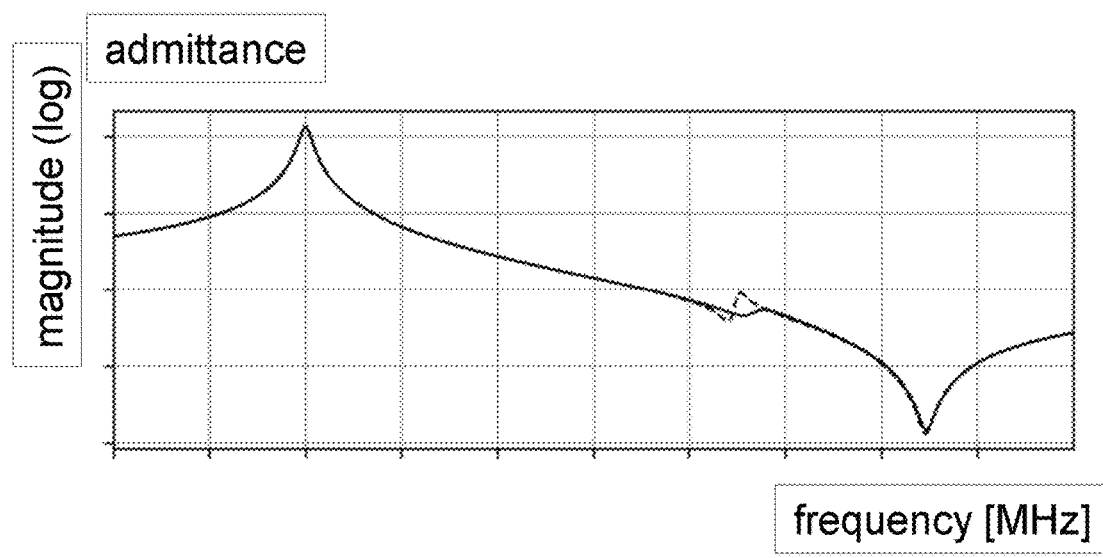
FIG. 4 shows the magnitude of the admittance of the same resonator like FIG. 3

This positive effect can also be detected in the diagram of FIG. 4 comparing the magnitudes of admittance of a standard resonator and the resonator of the embodiment. While the resonance of the main mode keeps constant the peak of the spurious mode is reduced significantly.

Figure 5:
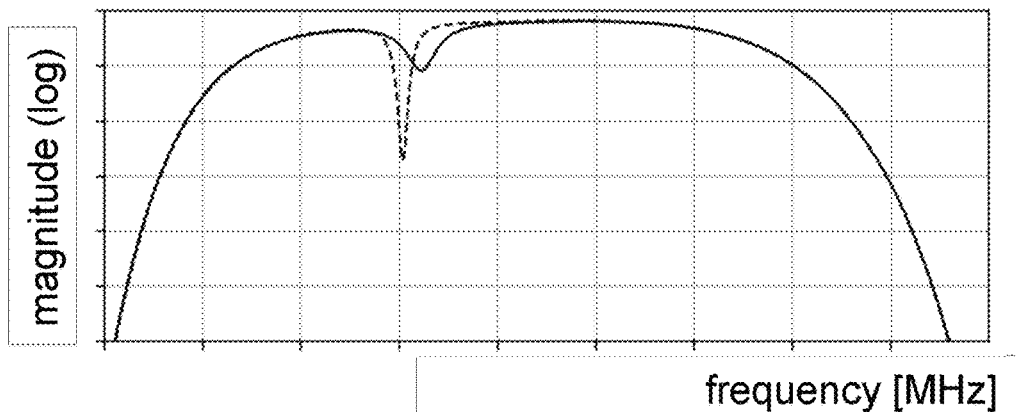
FIG. 5 shows a passband of a SAW filter comprising two resonators as shown in FIGS. 3 and 4

A SAW filter with ladder type structure comprising one series resonator and one parallel resonator is formed using two resonators each having a transducer according to the embodiment. The calculated transmission in the passband region of such a filter is depicted in FIG. 5. For reference the dashed line depicts a respective passband of a filter comprising two standard SAW resonators. The admittance characteristics of series and parallel resonator correspond to those of a standard SAW resonator with non-vanishing spurious modes (dashed line) and a SAW resonator according to the embodiment (solid line) as shown in FIGS. 3 and 4. It can be seen that the solid line according to the embodiment shows a significantly reduced passband dip compared to the standard SAW resonator.

Figure 6A:
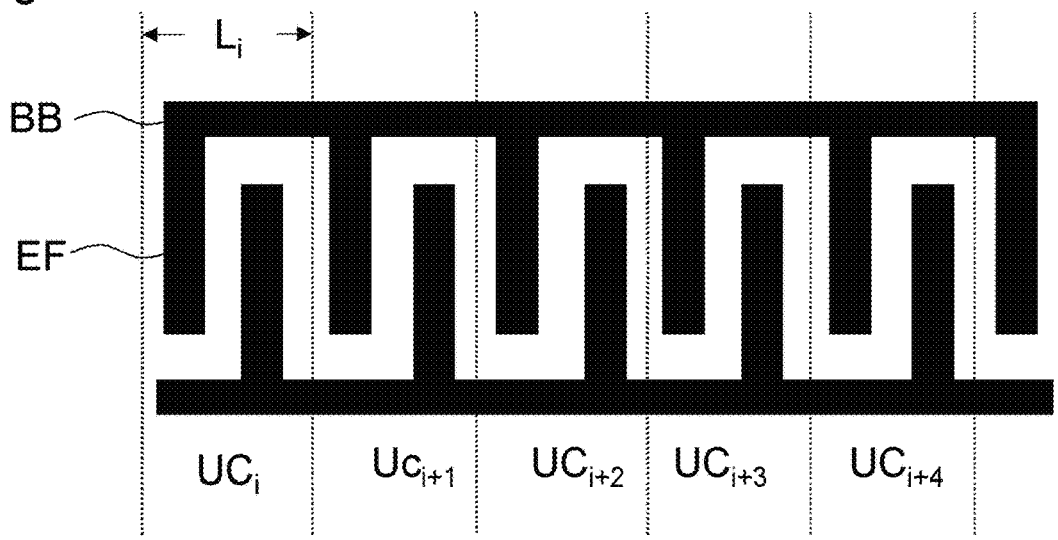
FIG. 6A shows unit cells $UC_i$ of a transducer

FIG. 6A shows the structure of a transducer composed of unit cells $UC_i$. Usually each unit cell $UC_i$ consists of two electrode finger EF connected to different busbars BB and hence, to different electric potentials. Each length $L_i$ complies with the wavelength $\lambda$ of an acoustic wave that can be excited when applying an RF signal to the two busbars BB. Dependent on the metallization ratio applied in a respective unit cell different geometrical lengths are required to excite the same frequency. Due to the small differences the variation of the two parameters are not visible by merely looking on the structure as depicted.

Figure 6B:
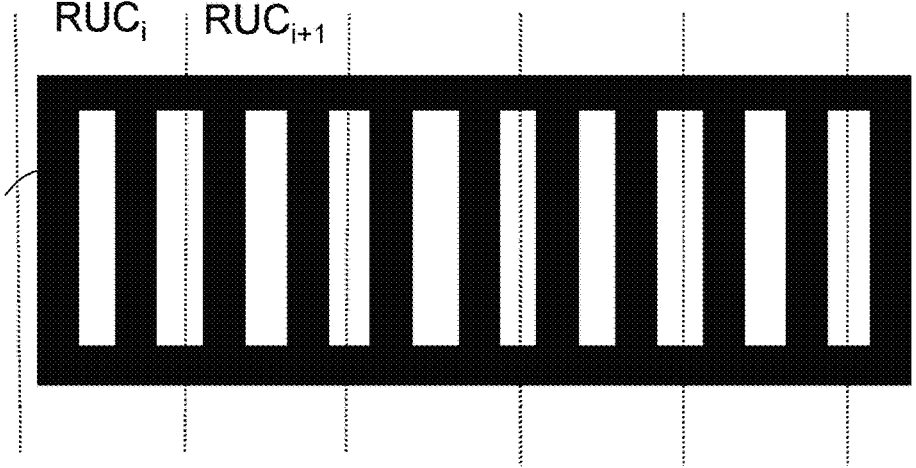
FIG. 6B shows unit cells $RUC_i$ of a reflector

FIG. 6B shows unit cells $RUC_i$ of a reflector REF. Each reflector unit cell comprises two reflecting stripes that are shorted by two "busbars". The same frequency determining parameters may be varied over the length of such a reflector similar like the transducer unit cell variation to yield a reflector performance wherein the wavelets of the main mode superimpose constructively and are hence totally reflected while the reflection of spurious modes is reduced due to non-constructive superposition of the respective wavelets. Alternatively, at least two frequency-relevant geometry and/or material parameters of the reflector unit cells differ from the corresponding parameters in the neighboring transducer so that the frequency of the reflector stopband relative to the transducer resonance differs for different acoustic modes.

Figure 7:
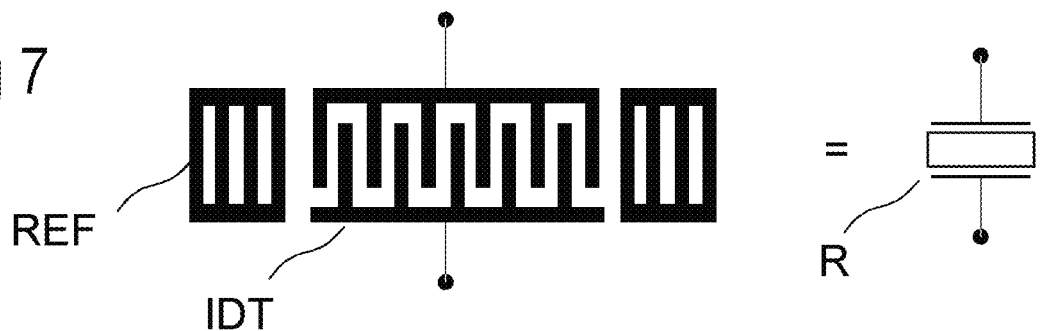
FIG. 7 shows a resonator comprising the transducer and reflectors

FIG. 7 show a SAW resonator R that may comprise a transducer IDT with the proposed parameter variation. The SAW transducer IDT is arranged between two reflective gratings REF that may be shorted to form reflectors. On the right side of the figure the circuit symbol of a resonator R as used in a block diagram is shown.

Figure 8:
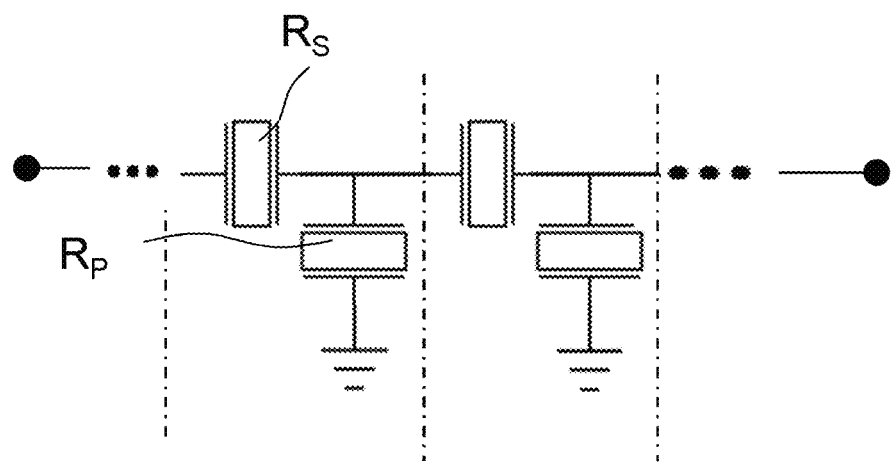
FIG. 8 shows a SAW filter comprised of series and parallel resonators

FIG. 8 shows a possible structure of a SAW filter with ladder type structure. Such a filter consists of a number of series resonators $R_S$ connected in series in a series signal line and a number of parallel resonators $R_P$ each arranged in a shunt arm branching from the series signal line. The number of resonators in the filter is set dependent on the desired degree of selectivity. According filter design rules are well known in the art.

At least one resonator of any type chosen from series and parallel resonators has a transducer and/or reflector with the proposed parameter variations. Also at this type of a SAW filter the advantageous reduction of spurious modes can be achieved resulting in improved insertion attenuation, smoother skirts, reduced group delay ripple, improved out-of-band reflection, improved compression and improved power durability behavior.

Figure 9:
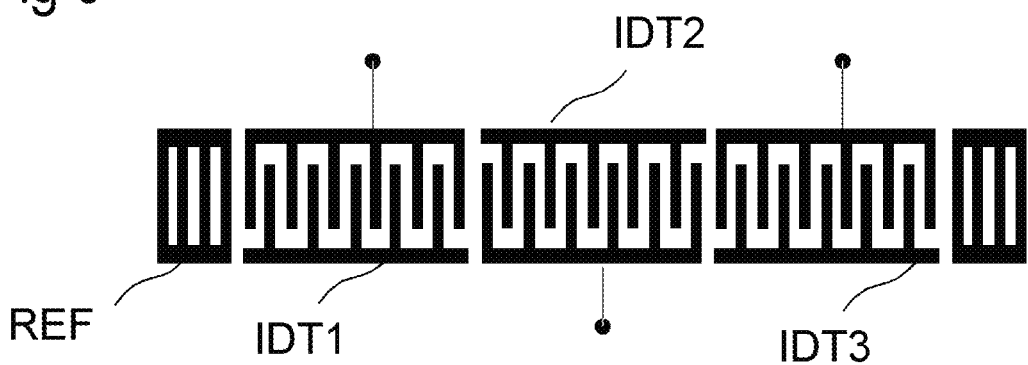
FIG. 9 shows a SAW filter embodied as a DMS filter using transducers according to an embodiment.

FIG. 9 shows an exemplary simplified SAW filter of the DMS type that may be construed from transducers and/or reflectors having the proposed parameter variation. A DMS filter comprises a number of transducers IDT to $IDT_3$ that are arranged in an acoustic track between two acoustic reflective gratings REF. The IDTs are alternatingly connected to input and output terminal respectively of the filter. A symmetrical structure is preferred. At least one of the resonators of one type chosen from input transducer and output transducer shows the proposed parameter variation. Also at this type of SAW filters the advantageous reduction of spurious modes can be achieved resulting in improved insertion attenuation, smoother skirts, reduced group delay ripple, improved out-of-band reflection, improved compression and improved power durability behavior.

Despite being explained on the depicted embodiments only the invention is not restricted by the shown embodiments and figures. The scope is defined by the claims only and may comprise variations deviating from the figures.

| List of used terms and reference symbols | |
|---|---|
| BB | busbar |
| EF | electrode finger |
| IDT | SAW transducer |
| $L_i$ | length of unit cell $UC_i$ |
| REF | reflective grating/acoustic reflector |
| $R_P$ | series SAW resonator |
| $R_S$ | series SAW resonator |
| $RUC_i$ | reflector unit cell |
| $UC_i$ | transducer unit cell |
| $\eta_i$ | metallization ratio of unit cell $UC_i$ |
| $W_i$ | wavelet |
| | eigenfrequency |
| | longitudinal direction |
| | main mode |
| | pitch of transducer |
| | SAW filter |
| | spurious mode |

The invention claimed is:

1. A surface acoustic wave (SAW) transducer comprising:
a plurality of unit cells that are arranged consecutively in a longitudinal direction, the plurality of unit cells having parameters including a length Li and a metallization ratio ηi, wherein each unit cell of the plurality of unit cells comprises two or more electrode fingers connected to different electrical potentials and is configured to produce a wavelet Wi, wherein the plurality of unit cells show a variation of the parameters Li and ηi over a length of the SAW transducer;
wherein the variation of the parameters Li and ηi over the length of the SAW transducer is such that, for each unit cell, an eigenfrequency of a main operating SAW mode is unchanged and wavelets superimpose constructively at the eigenfrequency of the main operating SAW mode.

2. The SAW transducer of claim 1, wherein, based on the variation, the eigenfrequency of unwanted resonances differs between neighboring unit cells and the wavelets superimpose at least partially destructively at a frequency of a spurious mode and/or an envelope of the spurious mode along the SAW transducer is shaped so that an excitation maximum is reduced and/or a frequency thereof is shifted.

3. The SAW transducer of claim 1, wherein the length Li continuously increases and the metallization ratio ηi continuously decreases over the length of the SAW transducer.

4. The SAW transducer of claim 1, wherein the parameters Li and ni each have a sine-like variation across the length of the SAW transducer, wherein the sine-like variation of the parameters Li and ni have a phase difference of $\pi$ when graphed.

5. The SAW transducer of claim 1, wherein one of the parameters Li and ηi has a minimum and another has a maximum in a middle of the transducer.

6. The SAW transducer of claim 1 comprising one or more reflectors.

7. The SAW transducer of claim 1, wherein the SAW transducer is one of at least two transducers arranged between two reflectors to form a DMS filter.

8. A surface acoustic wave (SAW) transducer comprising:
a plurality of unit cells that are arranged consecutively in a longitudinal direction, the plurality of unit cells having parameters including a length Li, wherein each unit cell of the plurality of unit cells comprises two or more electrode fingers connected to different electrical potentials and is configured to produce a wavelet Wi, wherein the plurality of unit cells show a variation of Li and another frequency-relevant parameter over a length of the transducer;
wherein the variation of the parameters Li and the another frequency-relevant parameter over the length of the transducer is such that, for each unit cell, an eigenfrequency of a main operating SAW mode is unchanged and wavelets superimpose constructively at the eigenfrequency of the main operating SAW mode.

9. The SAW transducer of claim 8, wherein the length Li continuously increases and the another frequency-relevant parameter continuously decreases over the length of the SAW transducer.

10. The SAW transducer of claim 8, wherein the another frequency-relevant parameter corresponds to at least one of a metal height of the two or more electrode fingers, or a dielectric layer height, or a broadness of the two or more electrode fingers, or a combination thereof.

11. The SAW transducer of claim 8, wherein, based on the variation, the eigenfrequency of unwanted resonances differs between neighboring unit cells and the wavelets superimpose at least partially destructively at a frequency of a spurious mode and/or an envelope of the spurious mode along the SAW transducer is shaped so that an excitation maximum is reduced and/or ratio ni is shifted.

12. The SAW transducer of claim 8, wherein the length Li and the another frequency-relevant parameter each have a sine-like variations across the length of the SAW transducer, wherein the sine-like variations of the parameters Li and ni have a phase difference of $\pi$ when graphed.

13. The SAW transducer of claim 8, wherein one of the length Li and the another frequency-relevant parameter has a minimum and another of has a maximum in a middle of the SAW transducer.

14. The SAW transducer of claim 8 comprising one or more reflectors.

15. The SAW transducer of claim 8, wherein the SAW transducer is one of at least two transducers arranged between two reflectors to form a DMS filter.

* * * * *